(12) United States Patent
Gans et al.

(10) Patent No.: US 12,223,998 B2
(45) Date of Patent: Feb. 11, 2025

(54) APPARATUSES AND METHODS FOR INPUT RECEIVER CIRCUITS AND RECEIVER MASKS FOR SAME

(71) Applicant: Lodestar Licensing Group LLC, Evanston, IL (US)

(72) Inventors: Dean D. Gans, Nampa, ID (US); John D. Porter, Boise, ID (US)

(*) Notice: Subject to any disclaimer, the term of this patent is extended or adjusted under 35 U.S.C. 154(b) by 0 days.

(21) Appl. No.: 18/606,198

(22) Filed: Mar. 15, 2024

(65) Prior Publication Data

US 2024/0221818 A1    Jul. 4, 2024

Related U.S. Application Data

(60) Continuation of application No. 18/312,747, filed on May 5, 2023, now Pat. No. 11,955,162, which is a continuation of application No. 17/161,204, filed on Jan. 28, 2021, now Pat. No. 11,682,447, which is a division of application No. 16/152,306, filed on Oct. 4, 2018, now Pat. No. 10,910,037.

(51) Int. Cl.
| | |
|---|---|
| G06F 3/06 | (2006.01) |
| G06F 13/16 | (2006.01) |
| G11C 11/4074 | (2006.01) |
| G11C 11/4076 | (2006.01) |

(52) U.S. Cl.
CPC ........ G11C 11/4076 (2013.01); G06F 3/0604 (2013.01); G06F 3/0659 (2013.01); G06F 3/0673 (2013.01); G06F 13/1689 (2013.01); G11C 11/4074 (2013.01)

(58) Field of Classification Search
None
See application file for complete search history.

(56) References Cited

U.S. PATENT DOCUMENTS

| | | | |
|---|---|---|---|
| 8,659,959 | B2 | 2/2014 | Kim et al. |
| 9,443,570 | B1 | 9/2016 | Song |
| 10,910,037 | B2 | 2/2021 | Gans et al. |
| 11,682,447 | B2 | 6/2023 | Gans et al. |
| 11,955,162 | B2 | 4/2024 | Gans et al. |

(Continued)

FOREIGN PATENT DOCUMENTS

| | | |
|---|---|---|
| CN | 101105972 A | 1/2008 |
| CN | 110320418 A | 10/2019 |

(Continued)

OTHER PUBLICATIONS

Extended European Search Report dated Jul. 5, 2022 for EP Application No. 198695535.5, pp. all.

(Continued)

*Primary Examiner* — Scott C Sun
(74) *Attorney, Agent, or Firm* — Dorsey & Whitney LLP

(57) ABSTRACT

Apparatuses and methods for input receiver circuits and receiver masks for electronic memory are disclosed. Embodiments of the disclosure include memory receiver masks having shapes other than rectangular shapes. For example, a receiver mask according to some embodiments of the disclosure may have a hexagonal shape. Other shapes of receiver masks may also be included in other embodiments of the disclosure. Circuits, timing, and operating parameters for achieving non-rectangular and various shapes of receiver mask are described.

29 Claims, 12 Drawing Sheets

(56) References Cited

U.S. PATENT DOCUMENTS

| | | | |
|---|---|---|---|
| 2005/0047728 | A1 | 3/2005 | Tobiason et al. |
| 2010/0232480 | A1 | 9/2010 | Bhandal et al. |
| 2012/0134681 | A1 | 5/2012 | Hamana et al. |
| 2017/0372769 | A1 | 12/2017 | Kizer et al. |
| 2018/0082725 | A1 | 3/2018 | Stott et al. |
| 2018/0131503 | A1 | 5/2018 | Duan et al. |
| 2019/0305898 | A1 | 10/2019 | Mao et al. |
| 2019/0385057 | A1* | 12/2019 | Litichever ............... H04L 63/14 |
| 2020/0111522 | A1 | 4/2020 | Gans et al. |
| 2021/0217459 | A1 | 7/2021 | Gans et al. |
| 2023/0420032 | A1 | 12/2023 | Gans et al. |

FOREIGN PATENT DOCUMENTS

| | | |
|---|---|---|
| EP | 2973579 B1 | 7/2018 |
| WO | 2020072389 A1 | 4/2020 |

OTHER PUBLICATIONS

International Search Report and Written Opinion dated Jan. 17, 2020 for PCT Application No. PCT/US2019/053899, 11 pgs.

IPRP dated Apr. 15, 2021 for PCT Application No. PCT/US2019/053899, pp. all.

KR Office Action dated Feb. 10, 2023 for KR Application No. 10-2021-7013049, pp. all.

"A Power-Efficient 2-Dimensional On-Chip Eye-Opening Monitor For GBPS Serial Links", Analog Integr. Circ. Sig. Process, vol. 76, No. 1, May 29, 2013, 12 pgs.

"Debugging Memory Interfaces Using Visual Trigger on Tektronix Oscilloscopes", https://download.tek.com/document/55W_29185_0_MR, Dec. 2013, 14 pages.

Al-Taee, Alaa R., et al., "A Power-Efficient 2-Dimensional On-Chip Eye-Opening Monitor for GBPS Serial Links", Analog Integr Circ Sig Process, No. 1, vol. 76, May 2013, 12 pgs.

Jedec: "Jedec Standard DDR4 SDRAM JESD79-4", Sep. 30, 2012 (Sep. 30, 2012), XP055293197, Arlington, VA Retrieved from the Internet: URL:http://www.softnology.biz/pdf/JESD79-4_DDR4_SDRAM.pdf [retrieved on Aug. 3, 2016], Sep. 2012; pp. all.

* cited by examiner

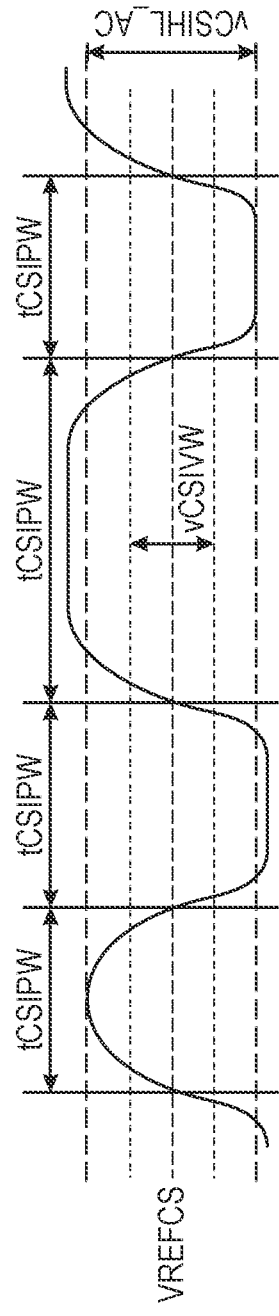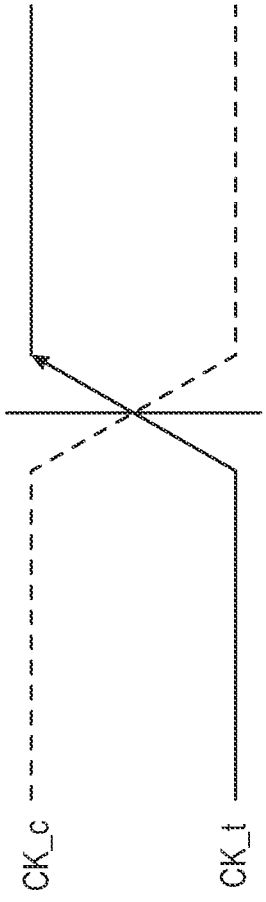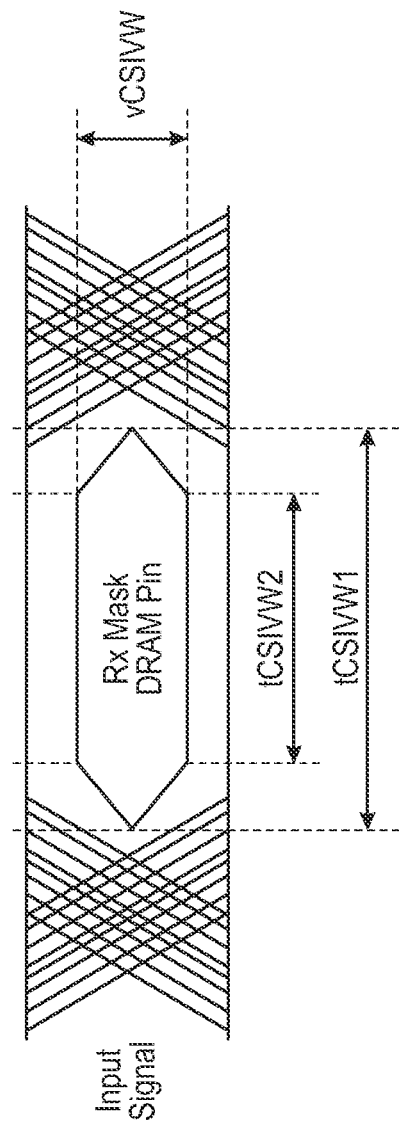

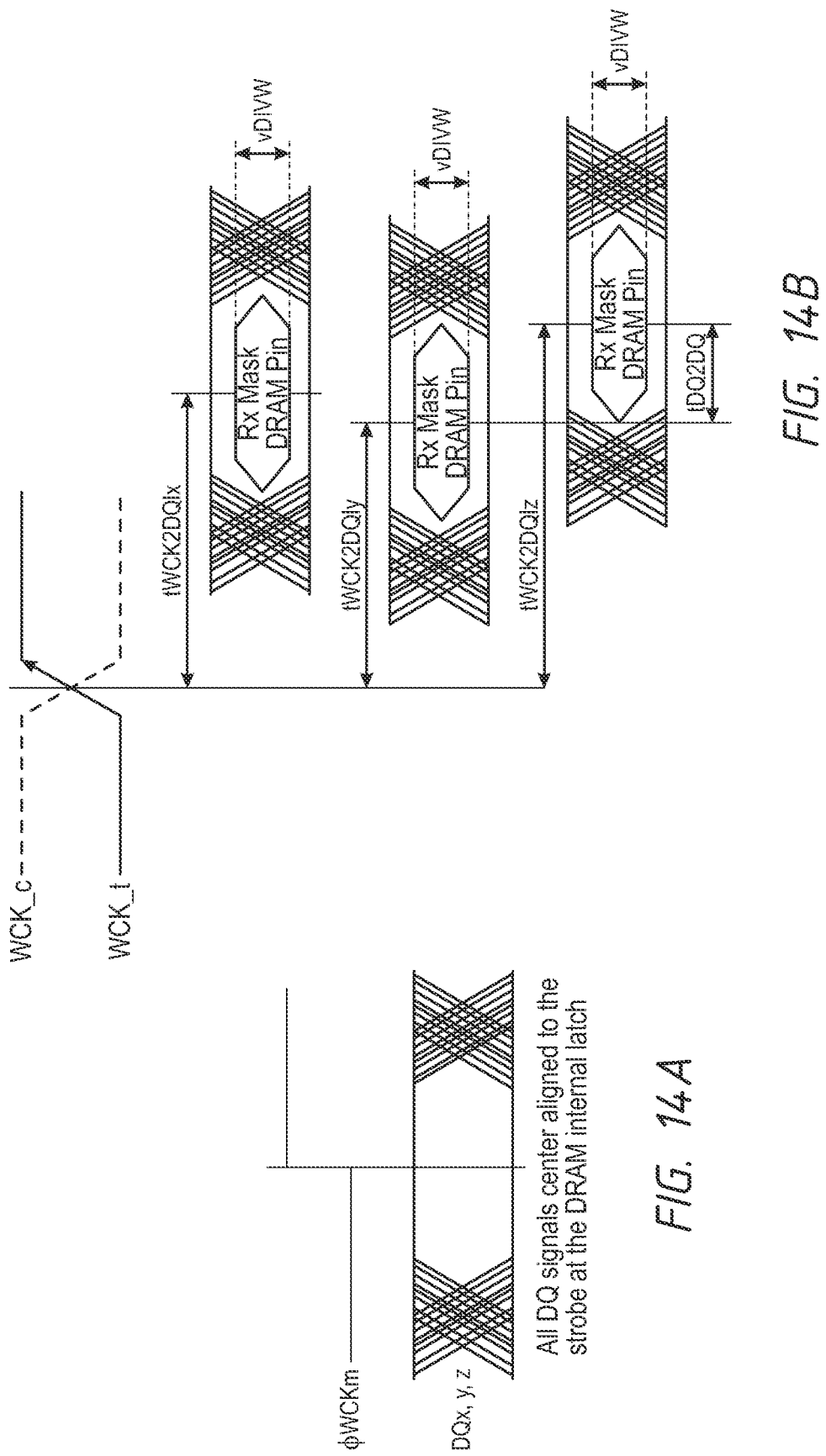

US 12,223,998 B2

APPARATUSES AND METHODS FOR INPUT RECEIVER CIRCUITS AND RECEIVER MASKS FOR SAME

CROSS REFERENCE TO RELATED APPLICATION(S)

This application is a continuation of U.S. patent application Ser. No. 18/312,747 which is a continuation of U.S. patent application Ser. No. 17/161,204 filed Jan. 28, 2021 and issued as U.S. Pat. No. 11,682,447 on Jun. 20, 2023, which is a divisional of U.S. patent application Ser. No. 16/152,306 filed Oct. 4, 2018 and issued as U.S. Pat. No. 10,910,037 on Feb. 2, 2021.

The aforementioned applications, and issued patents, are incorporated herein by reference, in its entirety, for any reason.

BACKGROUND

Semiconductor memories are used in many electronic systems to store data that may be retrieved at a later time. As the demand has increased for electronic systems to be faster, have greater data capacity, and consume less power, semiconductor memories that may be accessed faster, store more data, and use less power have been continually developed to meet the changing needs. Part of the development includes creating new specifications for controlling and accessing semiconductor memories, with the changes in the specifications from one generation to the next directed to improving performance of the memories in the electronic systems.

Semiconductor memories are generally controlled by providing the memories with command signals, memory addresses signals, and clocks. The various command and address signals, and clocks may be provided by a memory controller, for example. The command signals may control the semiconductor memories to perform various memory operations, for example, a read operation to retrieve data from a memory, and a write operation to store data to the memory. Data signals may be provided between the controller and memories with known timing relative to receipt by the memory of an associated command.

With newly developed memories, the memories may be provided with system clocks that are used for timing the commands and addresses, for example, and further provided with data clocks that are used for timing of read data provided by the memory and for timing of write data provided to the memory. The memories may also provide clocks to the controller for timing provision of data provided to the controller.

The external clocks provided to the memories are used to provide internal clocks that control the timing of various internal circuits during a memory operation. For example, the internal clocks may be used to clock input circuits to receive the various signals provided to the memories, such as the command and address signals, and data signals. Input receivers of the input circuits receive the input signals and capture valid input signals when the signals meet a specification that defines characteristics, for example, voltage and/or timing characteristics. Input signals that do not meet the specification cannot be guaranteed to be successfully captured by the input receivers. Additionally, as the frequency of system and data clocks increase, timing margins for capturing valid input signals by the input receivers decrease, making correct operation of memories more challenging.

BRIEF DESCRIPTION OF THE DRAWINGS

FIG. 10 is a diagram of a definition for a pulse of an input signal according to an embodiment of the disclosure.

FIG. 11 is a diagram showing a timing of input signals at external terminals of a semiconductor device according to an embodiment of the disclosure.

FIGS. 14A and 14B are diagrams showing timings of input signals at external terminals of a semiconductor device according to an embodiment of the disclosure.

DETAILED DESCRIPTION

Apparatuses and methods, including circuits, timing, and operating parameters, for achieving non-rectangular and various shapes of receiver mask within a memory system are described. As explained herein, typical receiver masks may have a rectangular shape. However, a rectangular shape may have limited timing margin for an input receiver to successfully capture an input signal. So embodiments of the disclosure include memory receiver masks having shapes other than rectangular shapes. For example, a receiver mask according to some embodiments of the disclosure may have a hexagonal shape. Other shapes of receiver masks may also be included in other embodiments of the disclosure.

Figure 1:
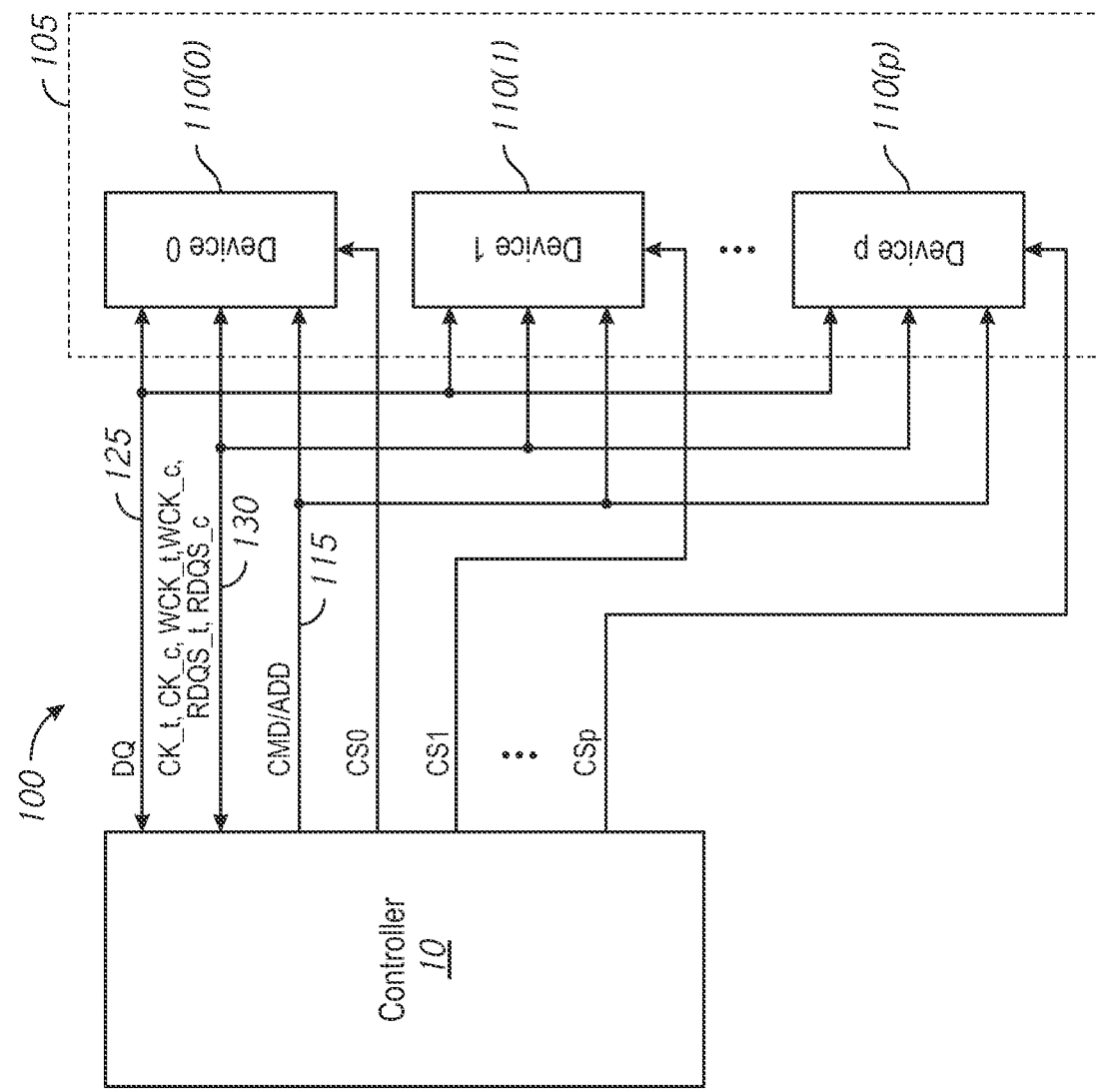
FIG. 1 is a block diagram of a system according to an embodiment of the disclosure.

FIG. 1 is a block diagram of a system 100 according to an embodiment of the disclosure. The system 100 includes a controller 10 and a memory system 105. The memory system 105 includes memories 110(0)-110($p$) (e.g., "Device 0" through "Device p"), where p is a number of the memories. The memories 110 may be dynamic random access memory (DRAM). The memories 110 may be low power double data rate (LPDDR) DRAM in some embodiments of the disclosure. The memories 110(0)-110($p$) are each coupled to the command/address, data, and clock busses. The controller 10 and the memory system 105 are in communication over several busses. Commands and addresses are received by the memory system 105 on a command/address bus 115, and data is provided between the controller 10 and the memory system 105 over a data bus 125. Various clocks may be provided between the controller and memory system 105 over a clock bus 130. The clock bus 130 may include signal lines for providing system clocks CK_t and CK_c received by the memory system 105, data clock WCK_t and WCK_c received by the memory system 105, and access data clocks RDQS_t and RDQS_c provided by the memory system 105 to the controller 10. Each of the busses may include one or more signal lines on which signals are provided.

The CK_t and CK_c clocks provided by the controller 10 to the memory system 105 are used for timing the provision and receipt of the commands and addresses. The WCK_t and WCK_c clocks and the RDQS_t and RDQS_c clocks are used for timing provision of data. The CK_t and CK_c clocks are complementary, the WCK_t and WCK_c clocks are complementary, and the RDQS_t and RDQS_c clocks are complementary. Clocks are complementary when a rising edge of a first clock occurs at a same time as a falling edge of a second clock, and when a rising edge of the second clock occurs at a same time as a falling edge of the first clock.

The controller 10 provides commands to the memory system 105 to perform memory operations. Examples of memory commands include timing commands for controlling the timing of various operations, access commands for accessing the memory, such as read commands for performing read operations and write commands for performing write operations, mode register write and read commands for performing mode register write and read operations, as well as other commands and operations. The command signals provided by the controller 10 to the memory system 105 further include select signals (e.g., chip select CS signals CS0, CS1, CSp). While all of the memories 110 are provided the commands, addresses, data, and clocks, the select signals provided on respective select signal lines are used to select which of the memories 110 will respond to the command and perform the corresponding operation. In some embodiments of the disclosure, a respective select signal is provided to each memory 110 of the memory system 105. The controller 10 provides an active select signal to select the corresponding memory 110. While the respective select signal is active, the corresponding memory 100 is selected to receive the commands and addresses provided on the command/address bus 115.

In operation, when a read command and associated address are provided by the controller 10 to the memory system 105, the memory 110 selected by the select signals receives the read command and associated address, and performs a read operation to provide the controller 10 with read data from a memory location corresponding to the associated address. The read data is provided by the selected memory 110 to the controller 10 according to a timing relative to receipt of the read command. For example, the timing may be based on a read latency (RL) value that indicates the number of clock cycles of the CK_t and CK_c clocks (a clock cycle of the CK_t and CK_c clocks is referenced as tCK) after the read command when the read data is provided by the selected memory 110 to the controller 10. The RL value is programmed by the controller 10 in the memories 110. For example, the RL value may be programmed in respective mode registers of the memories 110. As known, mode registers included in each of the memories 110 may be programmed with information for setting various operating modes and/or to select features for operation of the memories. One of the settings may be for the RL value.

In preparation of the selected memory 110 providing the read data to the controller 10, the controller provides active WCK_t and WCK_c clocks to the memory system 105. The WCK_t and WCK_c clocks may be used by the selected memory 110 to generate access data clocks RDQS_t and RDQS_c. A clock is active when the clock transitions between low and high clock levels periodically. Conversely, a clock is inactive when the clock maintains a constant clock level and does not transition periodically. The RDQS_t and RDQS_c clocks are provided by the memory 110 performing the read operation to the controller 10 for timing the provision of read data to the controller 10. The controller 10 may use the RDQS_t and RDQS_c clocks for receiving the read data.

In operation, when a write command and associated address are provided by the controller 10 to the memory system 105, the memory 110 selected by the select signals receives the write command and associated address, and performs a write operation to write data from the controller 10 to a memory location corresponding to the associated address. The write data is provided to the selected memory 110 by the controller 10 according to a timing relative to receipt of the write command. For example, the timing may be based on a write latency (WL) value that indicates the number of clock cycles of the CK_t and CK_c clocks after the write command when the write data is provided to the selected memory 110 by the controller 10. The WL value is programmed by the controller 10 in the memories 110. For example, the WL value may be programmed in respective mode registers of the memories 110.

In preparation of the selected memory 110 receiving the write data from the controller 10, the controller provides active WCK_t and WCK_c clocks to the memory system 105. The WCK_t and WCK_c clocks may be used by the selected memory 110 to generate internal clocks for timing the operation of circuits to receive the write data. The data is provided by the controller 10 and the selected memory 110 receives the write data according to the WCK_t and WCK_c clocks, which is written to memory corresponding to the memory addresses.

Figure 2:
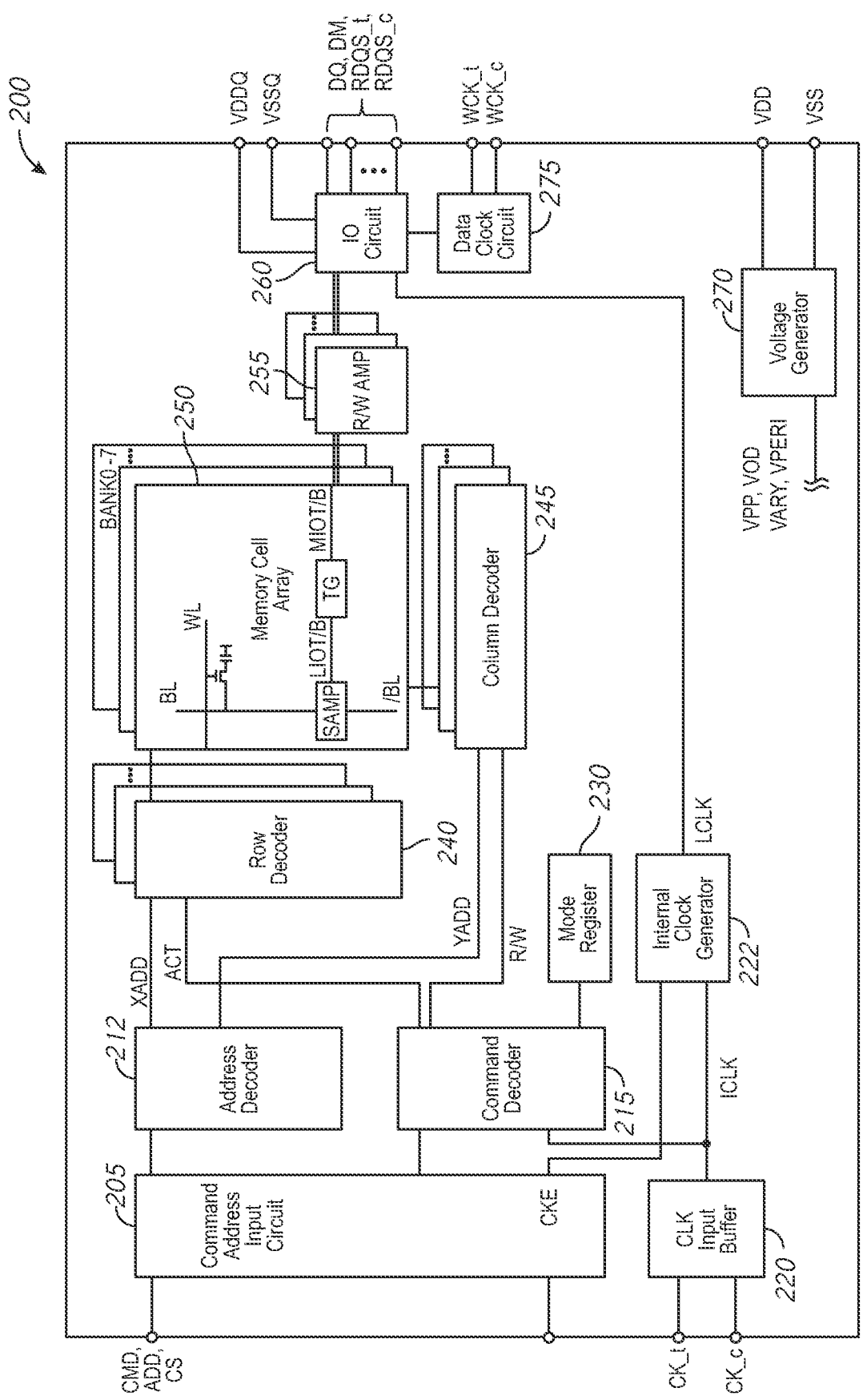
FIG. 2 is a block diagram of an apparatus according to an embodiment of the disclosure.

FIG. 2 is a block diagram of an apparatus according to an embodiment of the disclosure. The apparatus may be a semiconductor device 200, and will be referred to as such. The semiconductor device 200 may include, without limitation, a DRAM device. The semiconductor device 200 may be a low power DDR (LPDDR) memory integrated into a single semiconductor chip in some embodiments of the disclosure.

The semiconductor device 200 includes a memory array 250. The memory array 250 is shown as including a plurality of memory banks. In the embodiment of FIG. 2, the memory array 250 is shown as including eight memory banks BANK0-BANK7. Each memory bank includes a plurality of word lines WL, a plurality of bit lines BL and /BL, and a plurality of memory cells MC arranged at intersections of the plurality of word lines WL and the plurality of bit lines BL and/BL. Selection of the word line WL is performed by a row decoder 240 and selection of the bit lines BL and/BL is performed by a column decoder 245. In the embodiment of FIG. 2, the row decoder 240 includes a respective row decoder for each memory bank and the column decoder 245 includes a respective column decoder for each memory bank. The bit lines BL and/BL are coupled to a respective sense amplifier (SAMP). Read data from the bit line BL or/BL is amplified by the sense amplifier SAMP, and transferred to read/write amplifiers 255 over complementary local data lines (LIOT/B), transfer gate (TG), and complementary main data lines (MIOT/B). Conversely, write data outputted from the read/write amplifiers 255 is transferred to the sense amplifier SAMP over the complementary main data lines MIOT/B, the transfer gate TG, and the complementary local data lines LIOT/B, and written in the memory cell MC coupled to the bit line BL or/BL.

The semiconductor device 200 may employ a plurality of external terminals that include command and address and chip select (CA/CS) terminals coupled to a command and address bus to receive commands and addresses, and a CS signal. The external terminals may further include clock terminals to receive clocks CK_t and CK_c, and data clocks WCK_t and WCK_c, and to provide access data clocks RDQS_t and RDQS_c, data terminals DQ and DM, and power supply terminals to receive power supply potentials VDD, VSS, VDDQ, and VSSQ.

The clock terminals are supplied with external clocks CK_t and CK_c that are provided to an input buffer 220. The external clocks may be complementary. The input buffer 220 generates an internal clock ICLK based on the CK_t and CK_c clocks. The ICLK clock is provided to the command decoder 215 and to an internal clock generator 222. The internal clock generator 222 provides various internal clocks LCLK based on the ICLK clock. The LCLK clocks may be used for timing operation of various internal circuits. Data clocks WCK_t and WCK_c are also provided to the external clock terminals. The WCK_t and WCK_c clocks are provided to a data clock circuit 275, which generates internal data clocks based on the WCK_t and WCK_c clocks. The internal data clocks are provided to the input/output circuit 260 to time operation of circuits included in the input/output circuit 260, for example, to input receiver circuits (also input receivers) to time the receipt of write data.

The CA/CS terminals may be supplied with memory addresses. The memory addresses supplied to the CA/CS terminals are transferred, via a command/address input circuit 205, to an address decoder 212. The address decoder 212 receives the address and supplies a decoded row address XADD to the row decoder 240 and supplies a decoded column address YADD to the column decoder 245. The CA/CS terminals may be supplied with commands. Examples of commands include access commands for accessing the memory, such as read commands for performing read operations and write commands for performing write operations, mode register write and read commands for performing mode register write and read operations, as well as other commands and operations.

The commands may be provided as internal command signals to a command decoder 215 via the command/address input circuit 205. The command decoder 215 includes circuits to decode the internal command signals to generate various internal signals and commands for performing operations. For example, the command decoder 215 may provide a row command signal ACT to select a word line and a column command signal R/W to select a bit line.

The power supply terminals are supplied with power supply potentials VDD and VSS. The power supply potentials VDD and VSS are supplied to an internal voltage generator circuit 270. The internal voltage generator circuit 270 generates various internal potentials VPP, VOD, VARY, VTARGET, VPERI, and the like based on the power supply potentials VDD and VSS supplied to the power supply terminals. The internal potential VPP is mainly used in the row decoder 240, the internal potentials VOD and VARY are mainly used in the sense amplifiers SAMP included in the memory array 250, VTARGET may be a target voltage for the internal potential VARY, and the internal potential VPERI is used in many peripheral circuit blocks.

The power supply terminals are also supplied with power supply potentials VDDQ and VSSQ. The power supply potentials VDDQ and VSSQ are supplied to the input/output circuit 260. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 260 so that power supply noise generated by the input/output circuit 260 does not propagate to the other circuit blocks.

When a read command is received, and a row address and a column address are timely supplied with the read command, read data is read from memory cells in the memory array 250 corresponding to the row address and column address. The read command is received by the command decoder 215, which provides internal commands so that read data from the memory array 250 is provided to the read/write amplifiers 255. The read data is output to outside from the data terminals DQ via the input/output circuit 260. The RDQS_t and RDQS_c clocks are provided externally from clock terminals for timing provision of the read data by the input/output circuit 260. The external terminals DQ include several separate terminals, each providing a bit of data synchronized with a clock edge of the RDQS_t and RDQS_c clocks.

When the write command is received, and a row address and a column address are timely supplied with the write command, write data supplied to the data terminals DQ is written to a memory cells in the memory array 250 corresponding to the row address and column address. A data mask may be provided to the data terminals DM to mask portions of the data when written to memory. The write command is received by the command decoder 215, which provides internal commands so that the write data is received by input receivers in the input/output circuit 260. WCK_t and WCK_c clocks are also provided to the external clock terminals for timing the receipt of the write data by the input receivers of the input/output circuit 260. The write data is supplied via the input/output circuit 260 to the read/write amplifiers 255, and by the read/write amplifiers 255 to the memory array 250 to be written into the memory cell MC. As previously described, the external terminals DQ include several separate terminals. With reference to a write operation, each external terminal DQ concurrently receives a bit of data synchronized with a clock edge of the WCK_t and WCK_c clocks.

Various ones of the previously described circuits may include input receiver circuits that are used to receive input signals. For example, input receivers may be included in the command/address input circuit 205 to receive command and address signals, and to receive select signals. In another example, input receivers may be included in the input/output circuit 260 to receive data signals and/or signals related to data signals (e.g., data mask signals DM, error correction code signals, including parity signals, data bus inversion signals, etc.). The input receivers may receive input signals as timed by clocks. In some embodiments of the disclosure, the clocks may be CK_t and CK_c clocks (or clocks based on the CK_t and CK_c clocks), for example, for input receivers used to receive command and address signals, and/or input receivers used to receive select signals. In some embodiments of the disclosure, the clocks may be WCK_t and WCK_c clocks (or clocks based on the WCK_t and WCK_c clocks), for example, for input receivers used to receive data signals (or related to data signals). As previously mentioned, input receivers may capture valid input signals when the input signal meets a specification that defines characteristics (e.g., voltage and/or timing characteristics) of the input signals. As an example, an input signal may include a time-variant voltage characteristic that is based at least in part on predefined characteristics. Input signals that do not meet the specification cannot be guaranteed to be successfully captured by the input receivers.

Figure 3:
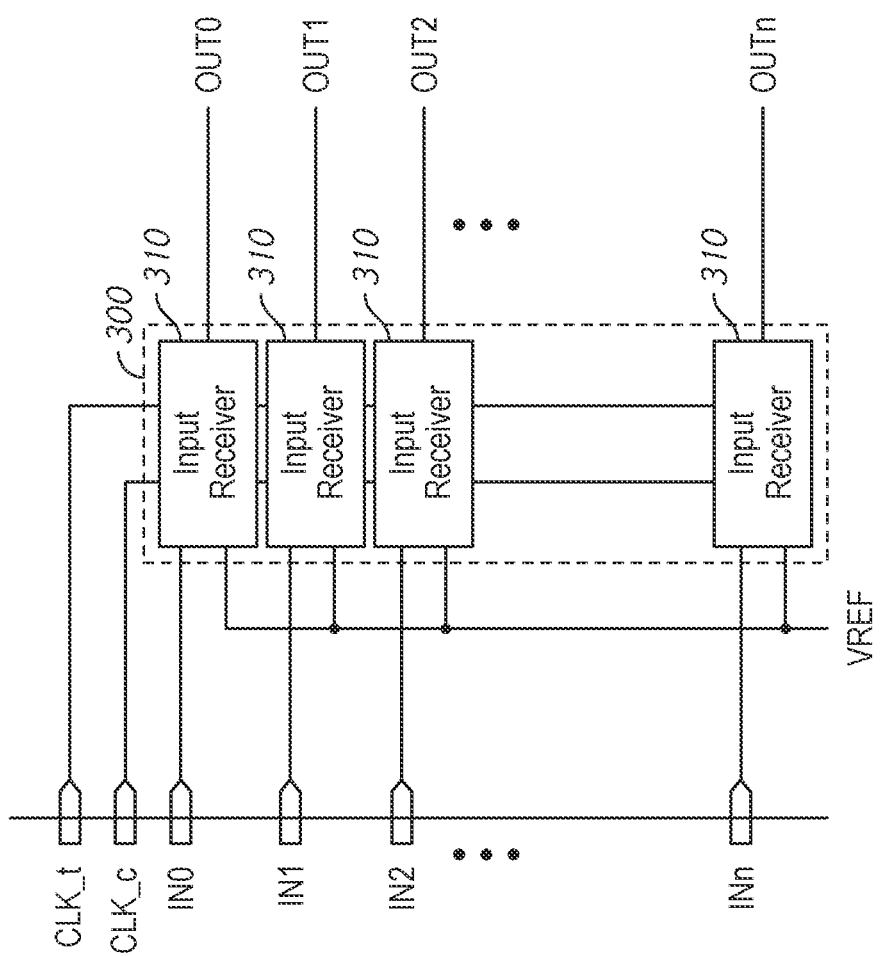
FIG. 3 is a block diagram of input circuits according to an embodiment of the disclosure.

FIG. 3 is a block diagram of an input circuit 300 according to an embodiment of the disclosure. The input circuit 300 may be included in an input/output circuit. In some embodiments of the disclosure the input circuit 300 is included in the input/output circuit 260 of the semiconductor device 200 FIG. 2. The input circuit 300 may be provided input signals IN0-INn from external terminals, where n is a number of the external terminals. The input circuit 300 may be further provided clocks CLK_t and CLK_c. The CLK_t and CLK_c clocks may be complementary. The CLK_t and CLK_c clocks may cause the input circuit 300 to capture the IN0-INn signals, thereby controlling a timing of the input circuit 300.

The input circuit 300 includes input receiver circuits 310 receive respective IN signals from the external terminals. Each of the input receivers 310 is caused by the CLK_t and CLK_c clocks to capture the respective IN signal. The input receivers 310 further receive a reference voltage VREF. The input receivers 310 compare a voltage of the respective IN signal to the VREF signal to determine a logic level of the respective IN signal and provide a respective output signal OUT having a voltage corresponding to a logic level that is based on the comparison. For example, an input signal having a voltage that is greater than the VREF voltage when captured by an input receiver is determined as a 1 logic level, and conversely, an input signal having a voltage that is less than the VREF voltage when captured by the input receiver is determined as a 0 logic level. The resulting respective output signals OUT provided by the input receivers have voltages that correspond to logic levels that are based on the logic levels of the respective input signals. The OUT signals may be provided to internal circuits for further operations. The input receivers 310 of the input circuit 300 may be implemented by conventional input receivers now known or later developed.

In various embodiments of the disclosure, the input signals may be, for example, command and address signals, select signals, input signals, and/or data signals. The CLK_t and CLK_c clocks may be, for example, system clocks CK_t and CK_c, data clocks WCK_t and WCK_c, and/or clocks based on system clocks, data clocks, etc. in various embodiments of the disclosure.

As previously described, input receiver circuits receive an input signal when clocked by a clock. The input signal should meet a specification that defines characteristics of the input signal for the input receivers to capture the input signal (e.g., accurately capture the data of the input signal). Input signals that do not meet the specification cannot be guaranteed to be successfully captured by the input receivers.

For example, the specification for an input signal may include defining a pulse of the input signal and defining a receiver mask for the input signal. A receiver mask defines an area an input signal must not encroach in order for an input receiver to capture the input signal. As an example, an input receiver captures the input signal when the input signal is without an area defined by a receiver mask, such as the input signal does not cross into the area of the receiver mask, the input signal remains outside of the area of the receiver mask, and the like. The receiver mask may be defined by timing and voltage parameters. Timing parameters may represent mask widths of the receiver mask and the voltage parameters may represent a mask height of the receiver mask. As an example, an input receiver may capture an input signal including a time-variant voltage characteristic that is based at least in part on the predefined receiver mask.

Typical receiver masks may have a rectangular shape. However, a rectangular shape may have limited timing margin for an input receiver to successfully capture an input signal. Where high frequency clocks are used to time operation of input receivers, increasing a margin for successfully capturing input signals may be desirable. Embodiments of the disclosure include receiver masks having shapes other than rectangular shapes. A receiver mask according to some embodiments of the disclosure may have a hexagonal shape.

Other shapes of receiver masks may be included in other embodiments of the disclosure, for example, polygonal shaped receiver masks having five or greater straight sides, as well as receiver masks having curved shapes such as circles, ellipses, etc. Receiver masks having shapes that may not be mirrored across an axis may also be included in embodiments of the disclosure, such as irregular polygonal and curved shapes.

Figure 4:
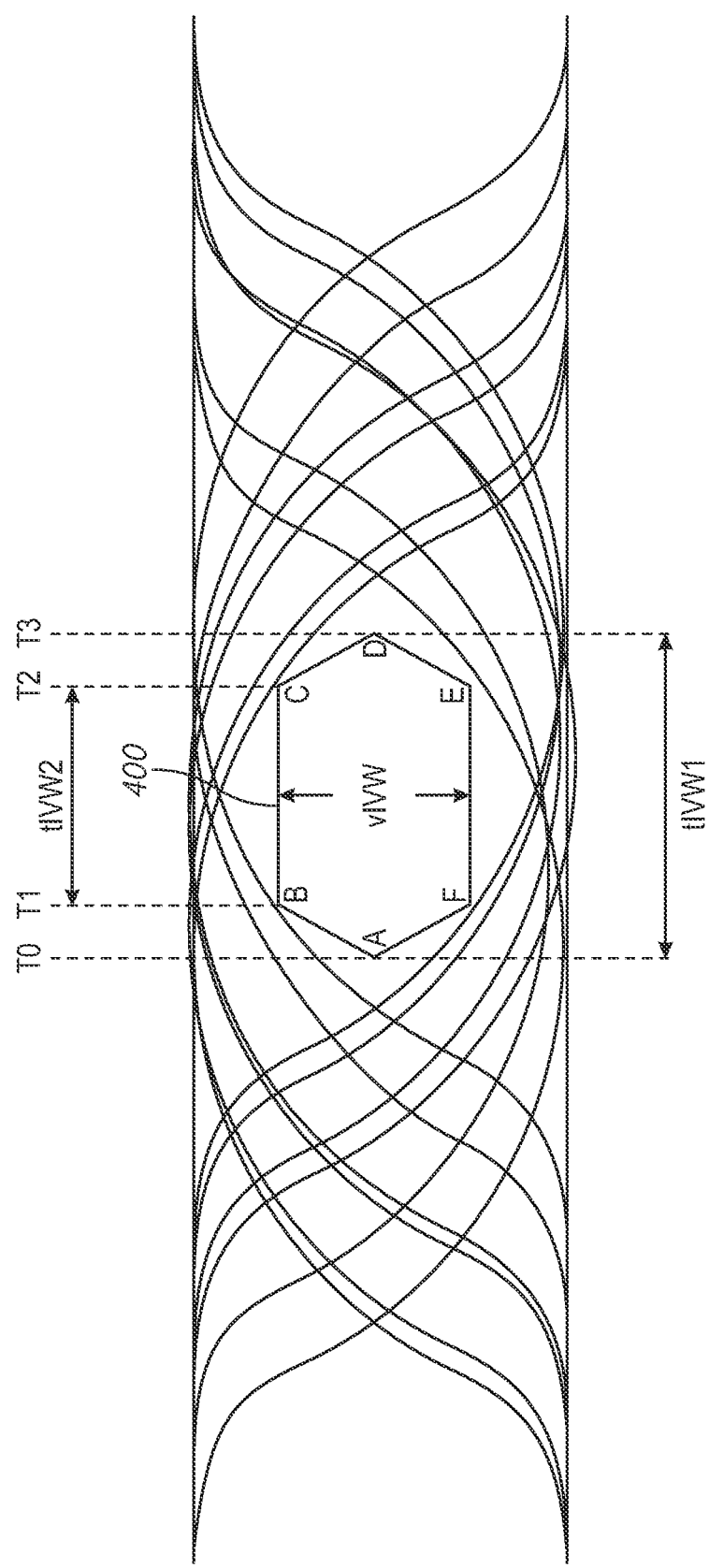
FIG. 4 is a diagram of a receiver mask for an input signal according to an embodiment of the disclosure.
Figure 5A:
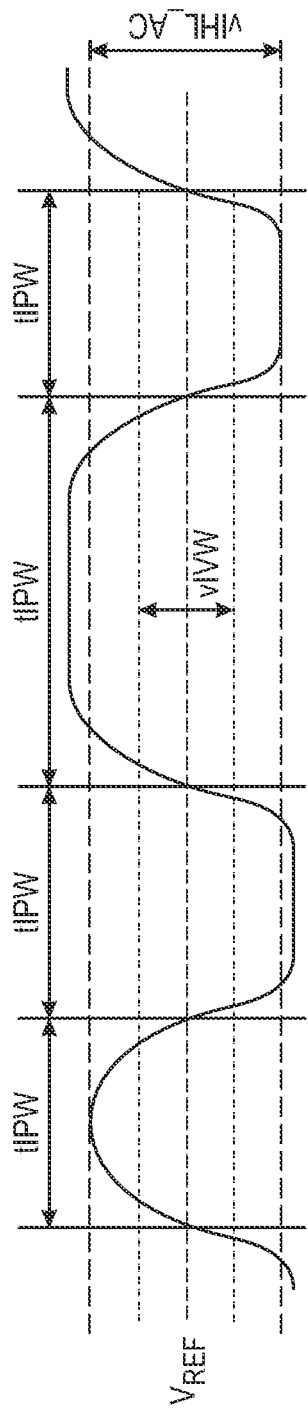
FIGS. 5A and 5B are diagrams of definitions for pulses of input signals according to some embodiments of the disclosure.
Figure 5B:
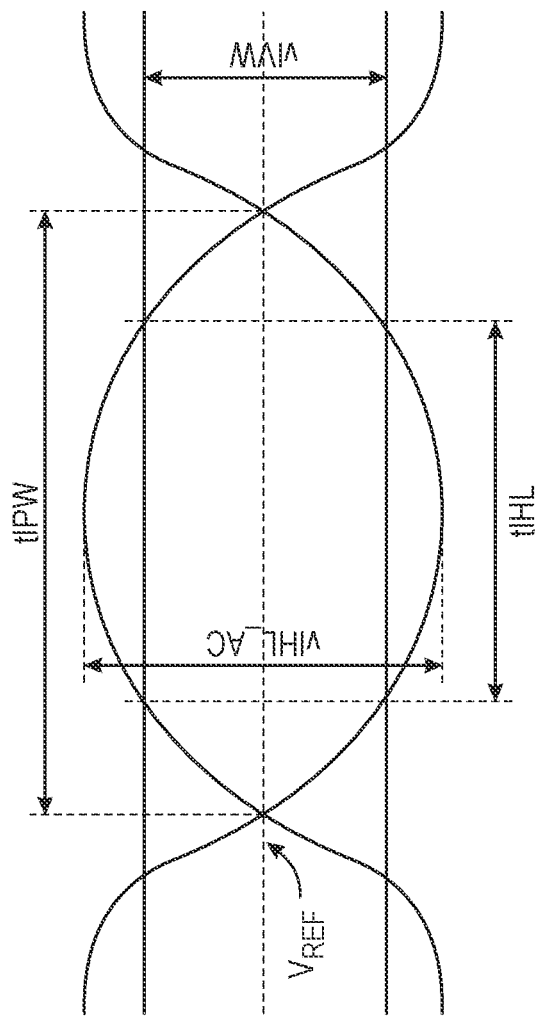

FIG. 4 is a diagram of a receiver mask for an input signal according to an embodiment of the disclosure. FIGS. 5A and 5B are diagrams of definitions for pulses of input signals according to some embodiments of the disclosure. As previously described, a receiver mask defines an area an input signal must not encroach in order for an input receiver to capture the input signal. Such input receivers may be included in different input circuits of the semiconductor device 200 of FIG. 2, for example, the command/address input circuit 205, the input/output circuit 260, etc. In some embodiments of the disclosure, such input receivers may be included in the input receivers 310 of the input circuit 300 of FIG. 3.

With reference to FIG. 4, a receiver mask 400 may be defined as a "hexagonal mask" shape. Several example input signals are shown in FIG. 4 as well, relative to the receiver mask 400. The input signals shown in FIG. 4 may be shifted in time and/or voltage relative to one another. However, none of the example input signals encroach the area of the receiver mask 400. As a result, an input receiver (e.g., input receivers 310 of FIG. 3) may capture the input signals.

The receiver mask 400 may be defined by timing and voltage parameters. For example, the receiver mask 400 of FIG. 4 is shown as having timing parameters tIVW1 and tIVW2, and a voltage parameter vIVW. The tIVW1 parameter is defined as a length of time between points A and D. Points A and D of the receiver mask 400 correspond to times T0 and T3. The points A and D are opposite to one another and represent vertices of the hexagonal mask. The tIVW2 parameter is defined as a length of time between points B and C and/or points F and E. The points B and C are at ends of side BC and points F and E are at ends of side FE. The points B and C and/or the points F and E correspond to times T1 and T2. The vIVW parameter is defined as a voltage difference between a voltage of side BC (e.g., an upper voltage) and a voltage of side FE (e.g., a lower voltage). The tIVW1 and tIVW2 parameters may represent mask widths of the receiver mask 400 and the vIVW parameter may represent a mask height of the receiver mask 400.

The receiver mask described with reference to FIG. 4 may provide greater timing margin compared to typical, rectangular shaped receiver masks. For example, the non-rectangular shape of the receiver mask of FIG. 4 may better allow for signals provided to an input receiver to transition from a low logic level voltage to a high logic level voltage, and vice versa. The rate of change of a signal from a low logic level voltage to a high logic level voltage, and vice versa, may be such that a rectangular receiver mask is encroached at the corners of the mask, especially when receiving signals at high clock speeds. A rectangular receiver mask is typically defined by one mask width. With reference to FIG. 4, a typical rectangular receiver mask would have a mask width equal to the timing parameter tCSIVW2. However, the non-rectangular receiver mask of FIG. 4 has a second timing parameter tCSIVW1, that is greater than the tCSIVW2 parameter, and likewise, greater than a mask width of a typical rectangular receiver mask. Consequently, the wider mask width of a non-rectangular receiver mask (e.g., the second timing parameter), for example, the receiver mask of FIG. 4, provides additional timing margin for an input receiver to capture an input signal. A system utilizing input receivers and receiver masks according to an embodiment of the disclosure may be capable of operating at faster clock speeds compared to conventional systems (e.g., system 100 of FIG. 1). Thus, embodiments of the disclosure may improve overall system performance compared to conventional systems.

FIGS. 5A and 5B show examples of pulses of input signals with a rising voltage (e.g., data "1") and a pulse of input signals with a falling voltage (e.g., data "0"). A pulse of an input signal is defined by timing and voltage parameters. For example, the pulse of the input signal of FIG. 5A is shown as having timing parameter tIPW and voltage parameters vIHL_AC, vIVW, and VREF, and the pulse of the input signal of FIG. 5B is shown as having timing parameters tIPW and tIHL, and voltage parameters vIHL_AC, vIVW, and VREF.

The tIPW parameter is defined as a length of time between intersections of a pulse with a reference voltage VREF. The VREF voltage may represent a voltage that is used to determine a logic level of an input signal. A voltage difference between an upper voltage and a lower voltage is defined as voltage vIVW. The vIVW voltage is centered around the VREF voltage. In some embodiments of the disclosure, the vIVW voltage may correspond to a parameter that is used to define a receiver mask. For example, the vIVW parameter was previously described with reference to the receiver mask 400 shown in FIG. 4. With specific reference to FIG. 5B, the tIHL parameter is defined as a length of time between intersections of a pulse with the upper voltage (e.g., for an input signal having an increasing voltage) or the lower voltage (e.g., for an input signal having a decreasing voltage).

The vIHL_AC parameter is defined as a peak to peak voltage between an upper voltage peak and a lower voltage peak of example rising and falling input signals. The vIHL_AC parameter is centered around the VREF voltage such that vIHL_AC/2 is met both above and below the VREF voltage. An input signal should meet or exceed the vIHL_AC at any time over an entire unit interval for the input signal. The upper voltage peak is greater than the upper voltage of the vIVW parameter and the lower voltage peak is less than the lower voltage of the vIVW parameter.

The tIPW parameter may represent a pulse width of the input signal and the tIHL parameter (FIG. 5B) may represent a pulse width above/below an upper/lower voltage of vIVW of the input signal. The vIHL_AC parameter may represent a pulse amplitude of the input signal.

Figure 6:
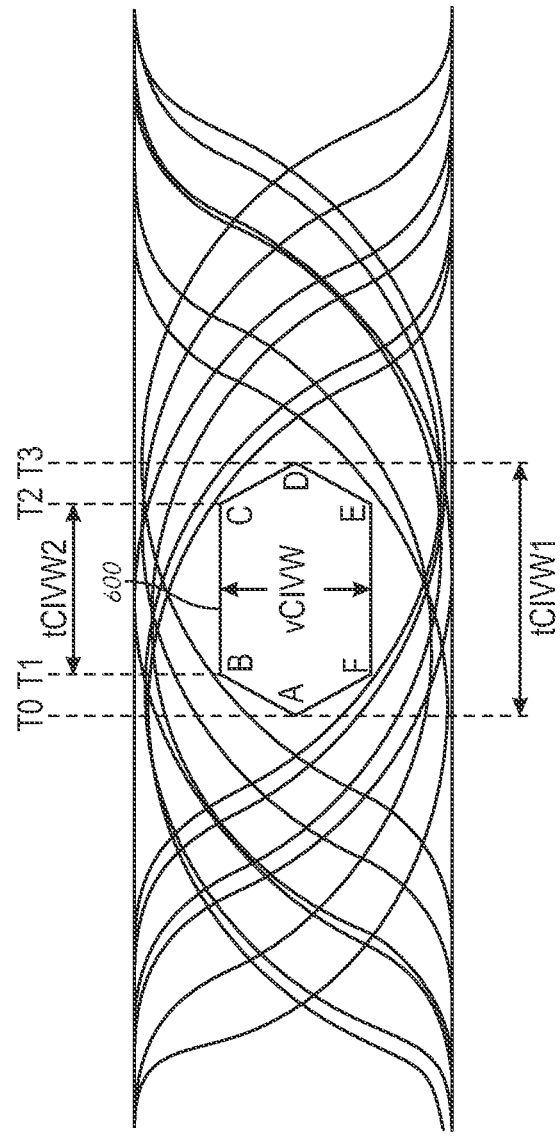
FIG. 6 is a diagram of a receiver mask for an input signal according to an embodiment of the disclosure.
Figure 7:
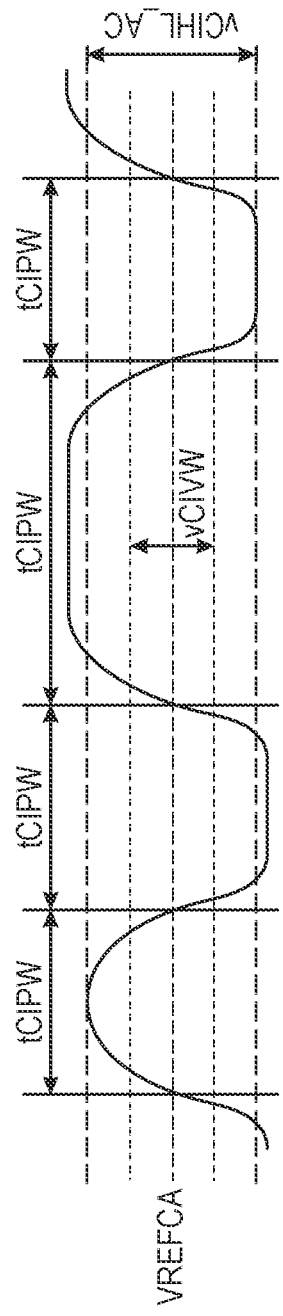
FIG. 7 is a diagram of a definition for a pulse of an input signal according to an embodiment of the disclosure.

FIG. 6 is a diagram of a receiver mask for an input signal according to an embodiment of the disclosure. FIG. 7 is a diagram of a definition for a pulse of an input signal according to an embodiment of the disclosure. In some embodiments of the disclosure, the receiver mask of FIG. 6 and the definition for a pulse of an input signal of FIG. 7 may be for an input receiver that receives command and/or address signals. Such input receivers may be included in the command/address input circuit 205 of the semiconductor device 200 of FIG. 2. In some embodiments of the disclosure, such input receivers may be included in the input receivers 310 of the input circuit 300 of FIG. 3.

With reference to FIG. 6, a receiver mask 600 is defined as a hexagonal mask shape. In embodiments where the input signals are command and/or address signals, the command and address signals apply the same compliance mask and operate in double data rate mode (e.g., captured at rising and falling edges of a clock). As previously described, the receiver mask defines an area that an input signal does not encroach in order for an input receiver to capture a valid input signal.

The receiver mask 600 of FIG. 6 is shown as having timing parameters tCIVW1 and tCIVW2, and a voltage parameter vCIVW. The tCIVW1 parameter is defined as a length of time between points A and D. Points A and D of the receiver mask 600 correspond to times T0 and T3. The points A and D are opposite to one another and represent vertices of the hexagonal mask. The tCIVW2 parameter is defined as a length of time between points B and C and/or points F and E. The points B and C are at ends of side BC and points F and E are at ends of side FE. The points B and C and/or the points F and E correspond to times T1 and T2. The vCIVW parameter is defined as a voltage difference between a voltage of side BC (e.g., an upper voltage) and a voltage of side FE (e.g., a lower voltage).

The tCIVW1 parameter may represent a mask width of the receiver mask 600 at a reference voltage VREFCA, and the tCIVW2 parameter may represent a mask width of the receiver mask 600 at vCIVW. The vCIVW parameter may represent a mask height of the receiver mask 600.

FIG. 7 shows examples of pulses of an input signal with a rising voltage (e.g., data "1") and a falling voltage (e.g., data "0"). The pulses of the input signal of FIG. 7 have a timing parameter tCIPW, and voltage parameters vCIHL_AC, vCIVW, and VREFCA. The tCIPW parameter is defined as a length of time between intersections of the pulses with a reference voltage VREFCA. The VREFCA voltage may represent a voltage that is used to determine a logic level of an input signal. A voltage difference between an upper voltage and a lower voltage is defined as voltage vCIVW. The vCIVW voltage is centered around the VREFCA voltage. In some embodiments of the disclosure, the vCIVW voltage may correspond to a parameter that is used to define a receiver mask. For example, the vCIVW parameter was previously described with reference to the receiver mask 600 shown in FIG. 6.

The vCIHL_AC parameter is a peak to peak voltage between an upper voltage peak and a lower voltage peak of example rising and falling input signals. The vCIHL_AC parameter is centered around the VREFCA voltage such that vCIHL_AC/2 is met both above and below the VREFCA voltage. An input signal should meet or exceed the vCIHL_AC at any time over an entire unit interval for the input signal. The upper voltage peak is greater than the upper voltage of the vCIVW parameter and the lower voltage peak is less than the lower voltage of the vCIVW parameter. However, vCIHL_AC does not have to be met when no transitions are occurring.

The tCIPW parameter may represent a pulse width of the input signal. The vCIHL_AC parameter may represent a pulse amplitude of the input signal.

Figures 8A, 8B:
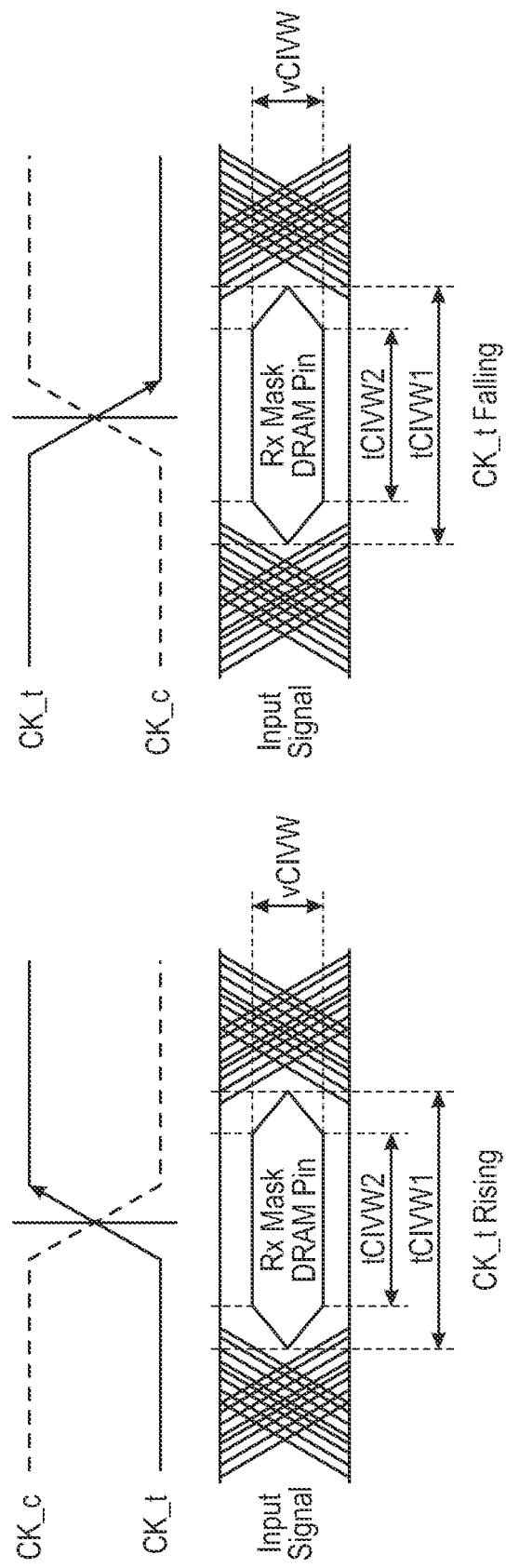
FIGS. 8A and 8B are diagrams of timings of input signals at external terminals according to an embodiment of the disclosure.

FIGS. 8A and 8B are diagrams of timings of input signals at external terminals according to an embodiment of the disclosure. The external terminals may be external terminals of a semiconductor device, for example, semiconductor device 200 of FIG. 2. In some embodiments of the disclosure, the timings of the input signals at the external terminals of FIGS. 8A and 8B may be used with the receiver mask 600 of FIG. 6.

FIG. 8A shows the timing of input signals at a rising clock edge of a system clock CK_t (and at a falling clock edge of a clock CK_c, which is complementary to the CK_t clock). FIG. 8B shows the timing of input signals at a falling clock edge of a clock CK_t (and at a rising clock edge of the CK_c clock). An example receiver mask is shown in FIGS. 8A and 8B. The receiver mask may be the receiver mask 600 of FIG. 6 in some embodiments of the disclosure, for example, having timing parameters tCIVW1 and tCIVW2, and voltage parameter vCIVW. The input signals do not encroach the receiver mask area.

Terms of the input signal timing at the external pins are measured from CK_t/CK_c (differential mode)/CK (single ended mode) to a center (midpoint) of the tCIVW1 and tCIVW2 window taken at a midpoint and vCIVW voltage level. The receiver mask window center is around a CK_t/CK_c cross point (differential mode)/CK (single ended mode).

Figure 9:
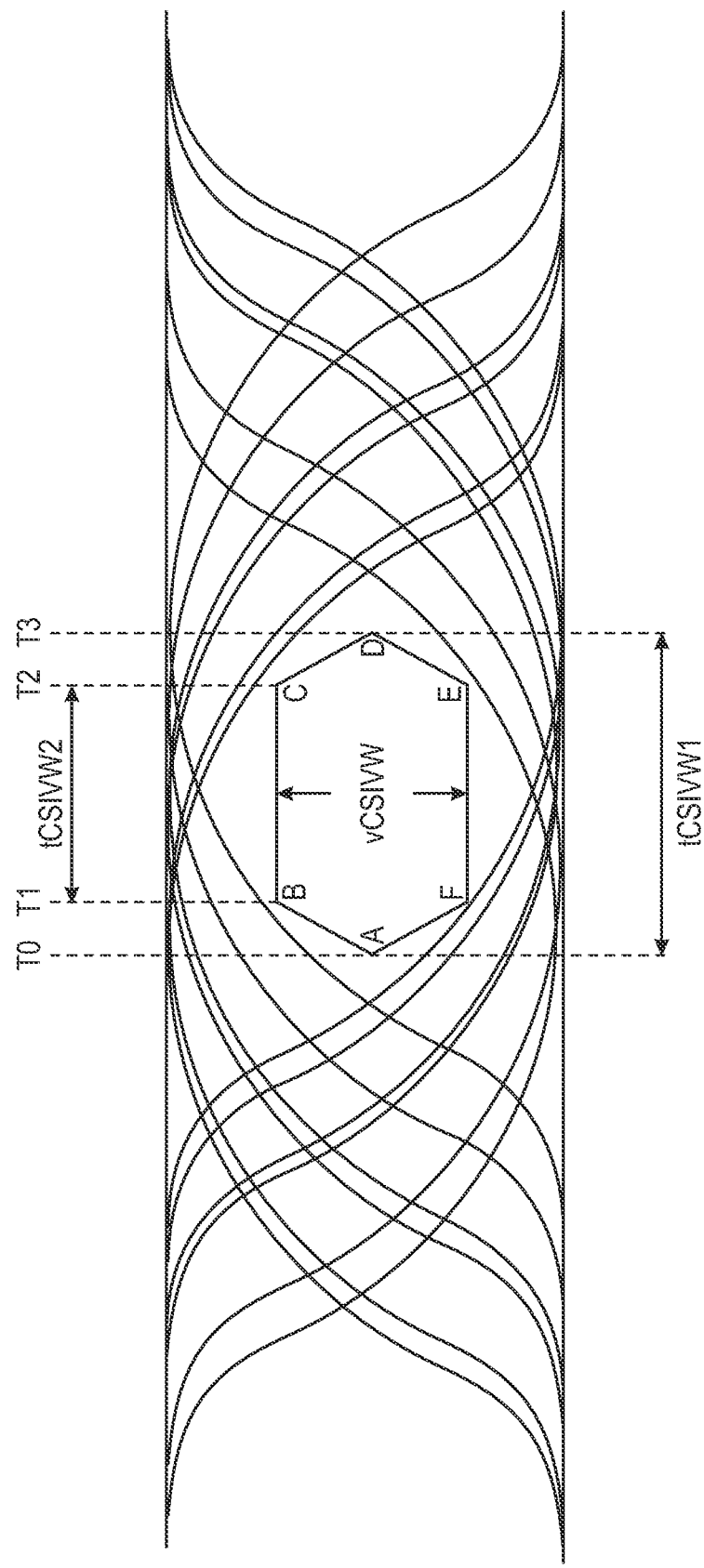
FIG. 9 is a diagram of a receiver mask for an input signal according to an embodiment of the disclosure.

FIG. 9 is a diagram of a receiver mask for an input signal according to an embodiment of the disclosure. FIG. 10 is a diagram of a definition for a pulse of an input signal according to an embodiment of the disclosure. In some embodiments of the disclosure, the receiver mask of FIG. 9 and the definition for a pulse of an input signal of FIG. 10 may be used for an input receiver that receives a select signal (e.g., a chip select signal). Such input receivers may be included in the command/address input circuit 205 of the semiconductor device 200 of FIG. 2. In some embodiments of the disclosure, such input receivers may be included in the input receivers 310 of the input circuit 300 of FIG. 3.

With reference to FIG. 9, a receiver mask 900 is defined as a hexagonal mask shape. In embodiments where the input signals are select signals, the select signals apply the same compliance mask and operate in a single data rate mode (e.g., captured at rising edges of a system clock). As previously described, the receiver mask defines an area that an input signal does not encroach in order for an input receiver to capture a valid input signal.

The receiver mask 900 of FIG. 9 is shown as having timing parameters tCSIVW1 and tCSIVW2, and a voltage parameter vCSIVW. The tCSIVW1 parameter is defined as a length of time between points A and D. Points A and D of the receiver mask 900 correspond to times T0 and T3. The points A and D are opposite to one another and represent vertices of the hexagonal mask. The tCSIVW2 parameter is defined as a length of time between points B and C and/or points F and E. The points B and C are at ends of side BC and points F and E are at ends of side FE. The points B and C and/or the points F and E correspond to times T1 and T2. The vCSIVW parameter is defined as a voltage difference between a voltage of side BC (e.g., an upper voltage) and a voltage of side FE (e.g., a lower voltage).

The tCSIVW1 parameter may represent a mask width of the receiver mask 900 at a reference voltage VREFCS, and the tCSIVW2 parameter may represent a mask width of the receiver mask 900 at vCSIVW. The vCSIVW parameter may represent a mask height of the receiver mask 900.

FIG. 10 shows examples of pulses of an input signal with a rising voltage (e.g., data "1") and a falling voltage (e.g., data "0"). The pulses of the input signal of FIG. 10 have a timing parameter tCSIPW, and voltage parameters vCSIHL_AC, vCSIVW, and VREFCS. The tCSIPW parameter is defined as a length of time between intersections of the pulses with a reference voltage VREFCS. The VREFCS voltage may represent a voltage that is used to determine a logic level of an input signal. A voltage difference between an upper voltage and a lower voltage is defined as voltage vCSIVW. The vCSIVW voltage is centered around the VREFCS voltage. In some embodiments of the disclosure, the vCSIVW voltage may correspond to a parameter that is used to define a receiver mask. For example, the vCSIVW parameter was previously described with reference to the receiver mask 900 shown in FIG. 9.

The vCSIHL_AC parameter is a peak to peak voltage between an upper voltage peak and a lower voltage peak of example rising and falling input signals. The vCSIHL_AC parameter is centered around the VREFCS voltage such that vCSIHL_AC/2 is met both above and below the VREFCS voltage. An input signal should meet or exceed the vCSIHL_AC at any time over an entire unit interval for the input signal. The upper voltage peak is greater than the upper voltage of the vCSIVW parameter and the lower voltage peak is less than the lower voltage of the vCSIVW parameter. However, vCSIHL_AC does not have to be met when no transitions are occurring.

The tCSIPW parameter may represent a pulse width of the input signal. The vCSIHL_AC parameter may represent a pulse amplitude of the input signal.

FIG. 11 is a diagram showing a timing of input signals at external terminals of a semiconductor device according to an embodiment of the disclosure. In some embodiments of the disclosure, the timings of the input signals at the external terminals of FIG. 11 may be used with the receiver mask 900 of FIG. 9.

FIG. 11 shows the timing of input signals at a rising clock edge of a clock CK_t (and at a falling clock edge of a clock CK_c, which is complementary to the CK_t clock). An example receiver mask is shown in FIG. 11. The receiver mask may be the receiver mask 900 of FIG. 9 in some embodiments of the disclosure, for example, having timing parameters tCSIVW1 and tCSIVW2, and voltage parameter vCSIVW. The example input signals do not encroach the receiver mask area.

Terms of the input signal timing at the external pins are measured from CK_t/CK_c (differential mode)/CK (single ended mode) to a center (midpoint) of the tCSIVW1 and tCSIVW2 window taken at a midpoint and vCSIVW voltage level. The receiver mask window center is around a CK_t/CK_c cross point (differential mode)/CK (single ended mode).

Figure 12:
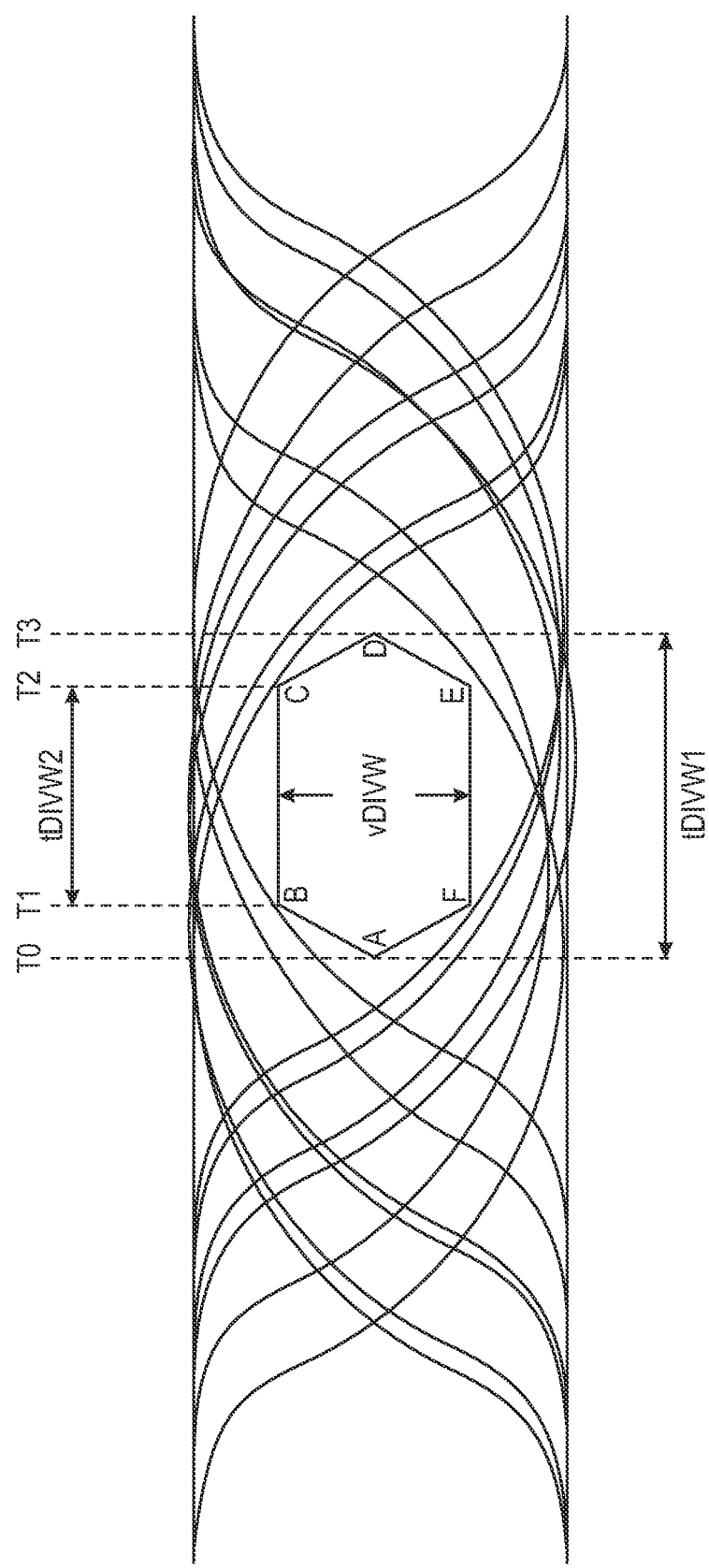
FIG. 12 is a diagram of a receiver mask for an input signal according to an embodiment of the disclosure.
Figure 13:
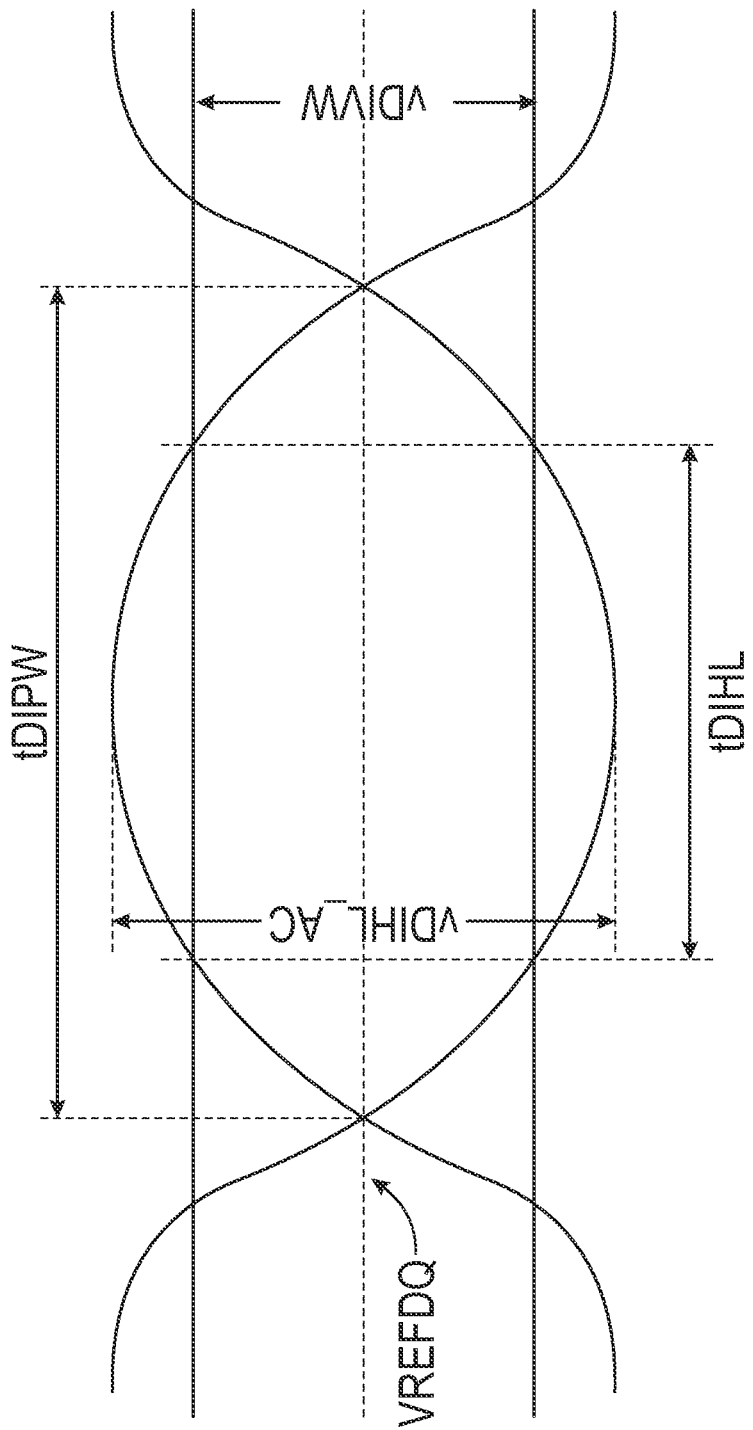
FIG. 13 is a diagram of a definition for a pulse of an input signal according to an embodiment of the disclosure.

FIG. 12 is a diagram of a receiver mask for an input signal according to an embodiment of the disclosure. FIG. 13 is a diagram of a definition for a pulse of an input signal according to an embodiment of the disclosure. In some embodiments of the disclosure, the receiver mask of FIG. 12 and the definition for a pulse of an input signal of FIG. 13 may be for an input receiver that receives data signals and/or signals related to data signals, for example, data mask signals, data inversion signals, error correction signals, etc.

Such input receivers may be included in the input/output circuit 260 of the semiconductor device 200 of FIG. 2. In some embodiments of the disclosure, such input receivers may be included in the input receivers 310 of the input circuit 300 of FIG. 3.

With reference to FIG. 12, a receiver mask 1200 is defined as a hexagonal mask shape. As previously described, the receiver mask defines an area that an input signal does not encroach in order for an input receiver to capture a valid input signal. The receiver mask 1200 of FIG. 12 is shown as having timing parameters tDIVW1 and tDIVW2, and a voltage parameter vDIVW. The tDIVW1 parameter is defined as a length of time between points A and D. Points A and D of the receiver mask 1200 correspond to times T0 and T3. The points A and D are opposite to one another and represent vertices of the hexagonal mask. The tDIVW2 parameter is defined as a length of time between points B and C and/or points F and E. The points B and C are at ends of side BC and points F and E are at ends of side FE. The points B and C and/or the points F and E correspond to times T1 and T2. The vDIVW parameter is defined as a voltage difference between a voltage of side BC (e.g., an upper voltage) and a voltage of side FE (e.g., a lower voltage). The tDIVW1 parameter may represent a mask width of the receiver mask 1200 at a reference voltage VREFDQ, and the tDIVW2 parameter may represent a mask width of the receiver mask 1200 at vDIVW. The vDIVW parameter may represent a mask height of the receiver mask 1200.

FIG. 13 shows examples of pulses of an input signal with a rising voltage (e.g., data "1") and a falling voltage (e.g., data "0"). The pulses of the input signal of FIG. 13 are shown as having timing parameters tDIPW and tDIHL, and voltage parameters vDIHL_AC, vDIVW, and VREFDQ. The tDIPW parameter is defined as a length of time between intersections of the pulses with a reference voltage VREFDQ. The VREFDQ voltage may represent a voltage that is used to determine a logic level of an input signal. The tDIHL parameter is defined as a length of time between intersections of a pulse with an upper voltage for vDIVW or a lower voltage for vDIVW. A voltage difference between an upper voltage and a lower voltage is defined as voltage vDIVW. The vDIVW voltage is centered around the VREFDQ voltage. In some embodiments of the disclosure, the vDIVW voltage may correspond to a parameter that is used to define a receiver mask. For example, the vDIVW parameter was previously described with reference to the receiver mask 1200 shown in FIG. 12.

The vDIHL_AC parameter is a peak to peak voltage between an upper voltage peak and a lower voltage peak of example rising and falling input signals. The vDIHL_AC parameter is centered around the VREFDQ voltage such that vDIHL_AC/2 is met both above and below the VREFDQ voltage. An input signal should meet or exceed the vDIHL_AC at any time over an entire unit interval for the input signal. The upper voltage peak is greater than the upper voltage of the vDIVW parameter and the lower voltage peak is less than the lower voltage of the vDIVW parameter.

The tDIPW parameter may represent a pulse width of the input signal at the VREFDQ voltage and tDIHL may represent a pulse width of the input signal above/below upper/lower voltages of vDIVW. The vDIHL_AC parameter may represent a pulse amplitude of the input signal.

FIGS. 14A and 14B are diagrams showing timings of input signals at external terminals of a semiconductor device according to an embodiment of the disclosure. The timing of the input signals may be referenced from an internal latch circuit. In some embodiments of the disclosure, the timings of the input signals at the external terminals of FIGS. 14A and 14B may be used with the receiver mask 1200 of FIG. 12.

FIG. 14A shows the timing of input signals at an internal latch circuit for a rising clock edge of an internal data clock WCKm. A "data-eye" of the input signals is center aligned to the WCKm clock. The input signals are center aligned to a strobe at the internal latch circuit. FIG. 14B shows the timing of input signals at a rising clock edge of a data clock WCK_t (and at a falling clock edge of the WCK_c clock, which is complementary to the WCK_t clock). Three example timings of input signals are shown in FIG. 14B with reference to a time tWCK2DQI following the rising clock edge of the WCK_t clock. The time tWCK2DQI is measured at a center (midpoint) of the tDIVW window. A first example is for input signals where an example receiver mask is center aligned at a time tWCK2DQIx following the rising clock edge of the WCK_t clock. A second example is for input signals where the example receiver mask is center aligned at a time tWCK2DQIy following the rising clock edge of the WCK_t clock. The tWCK2DQIy time represents a minimum tWCK2DQI time. A third example is for input signals where the example receiver mask is center aligned at a time tWCK2DQIz following the rising clock edge of the WCK_t clock. The tWCK2DQIz time represents a maximum tWCK2DQI time.

The receiver mask of FIG. 14B may be the receiver mask 1200 of FIG. 12 in some embodiments of the disclosure, for example, having timing parameters tDIPW and TDIHL, and voltage parameter vDIVW. The input signals do not encroach the receiver mask area.

From the foregoing it will be appreciated that, although specific embodiments of the disclosure have been described herein for purposes of illustration, various modifications may be made without deviating from the spirit and scope of the disclosure. For example, while specific examples of receiver masks previously described are hexagonal shaped, embodiments of the disclosure are not intended to be limited to hexagonal shaped receiver masks. As previously described, other shapes of receiver masks may be included in embodiments of the disclosure. Accordingly, the scope of the disclosure should not be limited any of the specific embodiments described herein.

Certain details are set forth herein to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

What is claimed is:

1. A memory device comprising:
  a memory array;
  a command address input circuit configured to receive a command address signal, the command address input circuit comprising a command address input receiver configured to capture an input command address signal that is based at least in part on a predefined receiver mask, wherein the receiver mask has a first timing parameter associated with a first voltage level and further has a second timing parameter associated with a second voltage level, wherein the second timing parameter is greater than the first timing parameter, wherein the predefined receiver mask has a hexagonal shape; and an external clock terminal configured to receive a clock signal, wherein a center of the receiver mask is at a cross point of the clock signal.

2. The memory device of claim 1, wherein the command address signals operate in a double data rate mode.

3. The memory device of claim 1, wherein a pulse of the input command address signal is defined, at least in part, by a third timing parameter indicating a length of time between intersections of the pulse with a reference voltage, a first voltage parameter indicating a peak-to-peak voltage centered around the reference voltage, and a second voltage parameter indicating an upper voltage and a lower voltage, wherein the second voltage parameter further corresponds to a voltage parameter of the receiver mask.

4. The memory device of claim 3, wherein an upper voltage peak of the peak-to-peak voltage is greater than the upper voltage and a lower voltage peak of the peak-to-peak voltage is less than the lower voltage.

5. The memory of claim 3, wherein the third timing parameter represents a pulse width of the input command address signal.

6. The memory of claim 3, wherein the first voltage parameter represents a pulse amplitude of the input command address signal.

7. The memory of claim 3, wherein the pulse is further defined by a fourth timing parameter indicating a length of time between intersections of the pulse with an upper voltage and a lower voltage.

8. The memory of claim 7, wherein the fourth timing parameter represents a pulse width above or below the upper voltage or the lower voltage of the input command address signal.

9. A method, comprising:
receiving, at a command address input receiver of a memory device, an input command address signal;
receiving, at an external clock terminal of the memory device, a clock signal; and
capturing a pulse of the input command address signal with a time-variant voltage characteristic that is based at least in part on a receiver mask, wherein the receiver mask is a hexagonal mask shape, wherein the pulse is center aligned to device cross point of the clock signal.

10. The method of claim 9, further comprising:
providing an address to an address decoder based on the input command address signal; and
providing a command to a command decoder based on the input command address signal.

11. The method of claim 9, wherein the clock comprises a first clock signal and a second clock signal, wherein the first and second clock signals are complementary and the cross point comprises a point where a voltage of the first clock signal and a voltage of the second clock signal are equal.

12. The method of claim 9, wherein a definition of the receiver mask includes a first timing parameter at a first voltage and by a second timing parameter at a second voltage, wherein the first timing parameter is longer than the second timing parameter.

13. The method of claim 12, wherein the first timing parameter represents a mask width at the first voltage and the second timing parameter represents a mask width at the second voltage.

14. The method of claim 12, wherein the definition of the receiver mask further includes a voltage parameter, the voltage parameter defined as a voltage difference between the first voltage and the second voltage.

15. An apparatus comprising:
a command address input circuit of a memory device configured to receive a command address input signal, wherein the command address input signal comprises a pulse defined, at least in part, by a first timing parameter indicating a length of time between intersections of the pulse with a reference voltage, a first voltage parameter indicating a peak-to-peak voltage, and second voltage parameter indicating an upper voltage and a lower voltage, wherein the second voltage parameter further corresponds to a voltage parameter of a receiver mask; and an external clock terminal configured to receive a clock signal, wherein the pulse is center aligned to a cross point of the clock signal.

16. The apparatus of claim 15, wherein the pulse is further defined by a second timing parameter indicating a length of time between intersections of the pulse with an upper voltage and a lower voltage.

17. The apparatus of claim 15, wherein the pulse is outside the receiver mask.

18. The apparatus of claim 15, wherein the reference voltage represents a voltage that is used to determine a logic level of the input command address signal.

19. The apparatus of claim 16, wherein the memory device comprises a low power dynamic random access memory.

20. The apparatus of claim 15, wherein the receiver mask comprises a hexagonal-shape.

21. A system comprising:
a memory device; and
a memory controller communicatively coupled to the memory device, the memory controller configured to:
provide to the memory device a clock signal; and
provide to the memory device a command address input signal outside a hexagonal receiver mask of the memory device, wherein the command address input signal is center aligned to a cross point of the clock signal,
wherein the memory device is configured to capture the command address input signal.

22. The system of claim 21, further comprising a command address bus coupling the memory device and the memory controller, wherein the memory controller is configured to provide the command address input signal via the command address bus.

23. The system of claim 21, further comprising a clock bus coupling the memory device and the memory controller, wherein the memory controller is configured to provide the clock signal via the clock bus.

24. The system of claim 21, wherein the clock signal comprises a pair of complementary clock signals, wherein the cross point of the clock signal comprises a time when voltages of the pair of clock signals are equal.

25. An apparatus comprising:
a memory controller communicatively coupled to a memory device, the memory controller configured to:
provide to the memory device a clock signal; and
provide to the memory device a command address input signal including a pulse defined, at least in part, by a first timing parameter indicating a length of time between intersections of the pulse with a reference voltage, a first voltage parameter indicating a peak-to-peak voltage, and second voltage parameter indicating an upper voltage and a lower voltage, wherein the second voltage parameter further corresponds to a voltage parameter of a receiver mask of the memory device, wherein the pulse is center aligned to a cross point of the clock signal.

26. The apparatus of claim 25, wherein the receiver mask of the memory device comprises a hexagonal shape.

27. The apparatus of claim 25, wherein the pulse is further defined by a second timing parameter indicating a length of time between intersections of the pulse with an upper voltage and a lower voltage.

28. The apparatus of claim 25, wherein the pulse is outside the receiver mask.

29. The apparatus of claim 25, wherein the clock signal comprises a pair of complementary clock signals, wherein the cross point of the clock signal comprises a time when voltages of the pair of clock signals are equal.

* * * * *